United States Patent [19]
Manning et al.

[11] Patent Number: 6,005,816
[45] Date of Patent: Dec. 21, 1999

[54] SENSE AMPLIFIER FOR COMPLEMENTARY OR NON-COMPLEMENTARY DATA SIGNALS

[75] Inventors: Troy A. Manning; Chris G. Martin, both of Boise, Id.

[73] Assignee: Micron Technology, Inc., Boise, Id.

[21] Appl. No.: 09/196,568

[22] Filed: Nov. 19, 1998

Related U.S. Application Data

[63] Continuation of application No. 08/899,524, Jul. 24, 1997.
[51] Int. Cl.$^6$ .............................. G11C 7/06; G01R 19/00
[52] U.S. Cl. ........................... 365/208; 365/190; 365/207; 327/52; 327/53
[58] Field of Search ................................ 365/190, 205, 365/207, 208; 327/51, 52, 53

[56] References Cited

U.S. PATENT DOCUMENTS

| | | | |
|---|---|---|---|
| 5,029,330 | 7/1991 | Kajigaya | 365/201 |
| 5,268,639 | 12/1993 | Gasbarro et al. | 324/158 R |
| 5,289,415 | 2/1994 | Dimarco et al. | 365/190 |
| 5,305,272 | 4/1994 | Matsuo et al. | 365/208 |
| 5,451,898 | 9/1995 | Johnson | 327/563 |
| 5,488,321 | 1/1996 | Johnson | 327/66 |
| 5,519,661 | 5/1996 | Miura | 365/205 |
| 5,621,340 | 4/1997 | Lee et al. | 327/65 |
| 5,684,750 | 11/1997 | Kondoh et al. | 365/205 |
| 5,708,607 | 1/1998 | Lee et al. | 365/189.05 |
| 5,809,038 | 9/1998 | Martin | 371/21.2 |

FOREIGN PATENT DOCUMENTS

| | | | |
|---|---|---|---|
| 0 283 960 A1 | 9/1988 | European Pat. Off. | G11C 29/00 |
| 0 828 252 A2 | 3/1998 | European Pat. Off. | G11C 7/06 |
| 0 840 328 A2 | 5/1998 | European Pat. Off. | G11C 29/00 |

OTHER PUBLICATIONS

Descriptive literature entitled, "400HMz SLDRAM, 4Mx16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc. New York, NY, pp. 1–56.

(List continued on next page.)

*Primary Examiner*—Son Mai
*Attorney, Agent, or Firm*—Seed and Berry LLP

[57] ABSTRACT

A sense amplifier that amplifies data signals in either a normal mode or an altered mode. In the normal mode, the data signals must be complementary of each other while in the altered mode, the data signals may, but need not be, complementary of each other. The sense amplifier includes two sense amplifier stages, the first of which drives the second, and each sense amplifier stage includes two identical sense amplifier circuits. A first input of each sense amplifier in the first stage receives a respective data signal, and a first input of each sense amplifier in the second stage receives an output signal from a respective sense amplifier in the first stage. In the normal mode, a mode control circuit couples each of the other data signals to a respective second input of each sense amplifier in the first stage so that the sense amplifiers receive both of the complimentary data signals at their differential inputs. In the altered mode, the mode control circuit couples a reference voltage to the second inputs of the sense amplifiers in the first stage so that the sense amplifiers compare a respective data signal to the reference voltage. The mode control circuit also alters the operation of the second stage. In the normal mode, the mode control circuit couples an output signal from the other sense amplifier in the first stage to a respective second input of each sense amplifier in the second stage so that the sense amplifiers receive at their differential inputs both of the complimentary output signals from each sense amplifier in the first stage. In the altered mode, the mode control circuit couples a data signal to the respective second input of each sense amplifier in the second stage so that the sense amplifiers compare an output signal from a respective sense amplifier in the first stage to a respective data signal.

12 Claims, 8 Drawing Sheets

OTHER PUBLICATIONS

Taguchi, M. et al., "A 40–ns 64–Mb DRAM with 64–b Parallel Data Bus Architecture," IEEE Journal of Solid–State Circuits, vol. 26, No. 11, Nov. 1991, pp. 1493–14997.

Taguchi M. et al., A 40ns 64Mb DRAM with Current–Sensing Data–Bus Amplifier, ISSCC Digest of Technical Papers, 1991, TAM 6.5.

Takeshi, N. et al., "A 17–ns 4–Mb CMOS DRAM," IEEE Journal of Solid State Circuits, vol. 26, No. 11, Nov. 1991, pp. 1538–1543.

Ishibashi, K. et al, "A 6–ns 4–Mb CMOS SRAM with Offset–Voltage–Insensitive Current Sense Amplifiers," IEEE Journal of Solid–State Circuits, vol. 30, No. 4, Apr. 1995, pp. 728–733.

Kuroda, T. et al., "Automated Bias Control (ABC) Circuit for High–Performance VLSI's," IEEE Journal of Solid–State Circuits, vol. 27, No. 4, Apr. 1992, pp. 539–545.

SENSE AMPLIFIER FOR COMPLEMENTARY OR NON-COMPLEMENTARY DATA SIGNALS

CROSS-REFERENCE TO RELATED APPLICATION

This application is a continuation of pending U.S. patent application Ser. No. 08/899,524, filed Jul. 24, 1997.

TECHNICAL FIELD

This invention relates to sense amplifiers of the type used in memory devices to sense the logic levels of complementary data signals, and more particularly, to a sense amplifier that is capable of sensing the logic levels of data signals that may be either complementary or non-complementary with respect to each other.

BACKGROUND OF THE INVENTION

Complementary data signals are commonly used in a variety of integrated circuits, such as memory devices, including a synchronous dynamic random access memory (SDRAM) 10 shown in FIG. 1. The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 which stores the row address, and a row decoder 28 which applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh counter 30 which is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48 which applies various signals to respective sense amplifiers and associated column circuitry 50, 52 for the respective arrays 20, 22.

Data to be read from one of the arrays 20, 22 is coupled to the column circuitry 50, 52 for one of the arrays 20, 22, respectively. The data is then coupled to a data output register 56 which applies the data to a data bus 58. Data to be written to one of the arrays 20, 22 is coupled from the data bus 58 through a data input register 60 to the column circuitry 50, 52 where it is transferred to one of the arrays 20, 22, respectively. A mask register 64 may be used to selectively alter the flow of data into and out of the column circuitry 50, 52, such as by selectively masking data to be read from the arrays 20, 22.

The above-described operation of the SDRAM 10 is controlled by a command decoder 68 responsive to high level command signals received on a control bus 70. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, which the "*" designating the signal as active low. The command decoder 68 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

To best understand the disclosed embodiment of the inventive sense amplifier, it is best to have an understanding of a portion of the circuitry conventionally used in the column circuitry 50, 52 and the data output register 56 in the SDRAM 10 of FIG. 1. The column circuitry 50, 52 for each of the memory arrays 20, 22 typically includes a sense amplifier (not shown) for each column in each array 20, 22, respectively. This sense amplifier will be referred to as a digit line sense amplifier to distinguish it from sense amplifiers of the type described and claimed herein which will sometime be referred to as an array sense amplifier. The digit line sense amplifier in the column circuitry 50, 52 for an addressed column receives complimentary signals from a pair of complimentary digit lines. The digit lines are, in turn, coupled to a pair of complimentary I/O lines by column addressing circuitry which is not shown in FIG. 1 for purposes of brevity. There are generally a pair of I/O lines included in each of the column circuitry 50, 52, i.e., one for each of the arrays 20, 22. Each pair of I/O lines is selectively coupled by a pair of complimentary data lines to the complimentary inputs of an array sense amplifier (not shown) included in the column circuitry 50, 52 or the data output register 56. The output of the active array sense amplifier is coupled to a bit of the data bus 58.

In the past, attempts have been made to expedite testing by reading data from the arrays 20, 22 using data compression in which the data from two or more memory cells in the arrays 20, 22 are combined to provide a single output. One technique for accomplishing this data compression has been by coupling the output terminals of several array sense amplifiers to comparison circuitry fabricated on the integrated circuit along with the memory device 10. Although this approach does expedite testing, there are nevertheless several problems in implementing this concept in increasing compact integrated circuit memory devices. At least some of these problems could be largely solved if data compression could occur "upstream" from the array sense amplifier. However, upstream data compression would inherently require that the array sense amplifier be capable of amplifying a pair of signals that may not be complimentary of each other. Unfortunately conventional array sense amplifiers are incapable of amplifying non-complimentary input signals, particularly amplifiers that can sufficiently amplify input signals that, while complementary, differ only slightly from each other. Yet substantial amplification of the input signals is necessary so that the outputs of the array sense amplifier can be interpreted as logic "0" and "1" values.

One embodiment of a conventional sense amplifier circuit is illustrated in FIG. 2. The sense amplifier circuit 100 includes a pair of PMOS transistors 112, 114 having their sources connected to a supply voltage VCC and their gates coupled to each other and to the drain of one of the PMOS transistors 114. In this configuration, the transistors 112, 114 act as current mirrors so that the current $I_1$ through the PMOS transistor 112 will be the same as the current $I_2$ through the PMOS transistor 114.

The drains of the PMOS transistors 112, 114 are connected to the drains of respective NMOS sense transistors 120, 122. The gate of one sense transistor 120 is coupled to the data line D while the gate of the other sense transistor 122 is coupled to the complement of the data line D*. The sources of the sense transistors 120, 122 are coupled to ground through an NMOS bias transistor 126 which is biased on by coupling its gate to a voltage $V^1$ which may be VCC or some other voltage between VCC and $V_T$, the transition voltage of the transistor 126.

Although not required for the operation of the sense amplifier circuit 100, a PMOS equilibration transistor 130 is coupled between the drains of the sense transistors 120, 122 to equalize their voltages prior to receipt of the complementary data signals D and D*. The drain of one of the sense transistors 120 is used as the output line 132 of the sense amplifier circuit 100.

The operation of the sense amplifier circuit 100 illustrated in FIG. 2 will be explained using exemplary voltage levels which are indicated in parentheses in FIG. 2. However, it will be understood that these voltage levels are provided only as examples since other voltage levels are often present in conventional sense amplifiers. Further, it will be assumed that VCC for the sense amplifier circuit 100 is 3.3 volts and that a logic "1" level of 3.2 volts is coupled to the gate of the sense transistor 120 while a logic "0" voltage of 2.9 volts is coupled to the gate of the sense transistor 122.

Insofar as the voltage applied to the gate of the sense transistor 120 is greater than the voltage applied to the gate of the sense transistor 122, the transistor 120 is turned on to a greater degree than transistor 122. As a result, the source to gate resistance of the transistor 120 is lower than the source to gate resistance of the transistor 122. As mentioned above, the PMOS transistors 112, 114 are configured as a current mirror so that $I_1$ and $I_2$ are equal to each other. As a result, the voltage across the lower resistance sense transistor 120 is lower than the voltage across the higher resistance sense transistor 122. For this reason, using the example shown in FIG. 2, the drain of the sense transistor 120 is at 2.7 volts while the drain of the sense transistor 122 is at 3.3 volts. The sense amplifier circuit 100 has thus boosted the differential between the complementary signals from 0.3 volts (i.e., 3.2–2.9) to 0.6 volts (i.e., 3.3–2.7). Prior to applying the complementary signals to the gates of the sense transistors 120, 122, the equilibration transistor 130 is turned on by conventional circuitry to place the drains of the sense transistors 120, 122 at a suitable voltage between 2.7 volts and 3.3 volts, e.g. 3.0 volts. As a result, it is necessary for the drain of either transistor 120, 122 to change by only 0.3 volts when the differential data signals are applied to the gates of the sense transistors 120, 122. The bias transistor 126 is provided to raise the absolute voltages at the drains of the source transistors 120, 122 to a suitable level since the voltage across the sense transistors 120, 122 is boosted by the voltage across the bias transistor 126. The sense amplifier circuit 100 is thus a differential amplifier that compares the voltage applied to the gate of one sense transistor 120 to the voltage applied to the gate of the other sense transistor 122.

In operation, the voltage at the drain of the sense transistor 120 changes to a greater extent than the voltage at the drain of the sense transistor 122 because the drain of the PMOS transistor 112 is not coupled to the gate of the transistor 112. On the other hand, coupling the drain of the PMOS transistor 114 to its gate limits the magnitude of the change in voltage at the gate of the sense transistor 122. Thus, in practice, the drain of the sense transistor 120 is generally preferred for use as the output node thus causing the sense amplifier circuit 100 to function as an inverting differential amplifier.

In practice, the sense amplifier circuit 100 illustrated in FIG. 2 is commonly used in the quad configuration shown in FIG. 3. The sense amplifier 140 shown in FIG. 3 uses two amplifier stages 142, 144 each of which consists of two sense amplifiers 100 of the type illustrated in FIG. 2.

As mentioned above, the drain of the PMOS transistor 112 changes to a larger extent than the voltage on the drain of the PMOS transistor 114 because the drain of the transistor 112 is not coupled to the gates of the PMOS transistors 112, 114. For this reason, using the drains of the sense transistors 120, 122 as differential outputs of each sense amplifier circuit 100 would result in an unbalance. Two sense amplifiers 100 are therefore used for each stage 142, 144. Further, two stages 142, 144 are used to provide a sufficient voltage differential on output lines 150, 152.

Each of the sense amplifiers 100 operates in essentially the same manner as explained above with reference to FIG. 2. Thus, the sense amplifier circuit 100a receives the data input D and its complement D* and generates an output corresponding to D*–D. Although an output signal is also generated at the drain of the PMOS transistor 114, it is not used because, as explained above, the change in voltage as a function of D*–D is greater at the drain of the PMOS transistor 112. Similarly, the sense amplifier circuit 100b receives the data signal D and its complement D* and generates an output signal that is proportional to D–D*. Since the output of the sense amplifier circuit 100b is also generated at the drain of the PMOS transistor 112, the sense amplifier circuit 100b has essentially the same topography as the sense amplifier circuit 100a. As a result, the change in voltage at the output of the sense amplifier circuit 100a corresponding to D*–D changes by the same magnitude as the output of the sense amplifier circuit 100b responsive to D–D*.

The balanced outputs from the first stage 142 are then applied to the second stage 144. More specifically, the sense amplifier circuit 100c receives the output of the sense amplifier circuit 100a (which is proportional to D–D*) and compares it to the output of the sense amplifier circuit 100b (which is proportional to D*–D). The output signal on output line 150 is thus proportional to (D–D*)–(D*–D) or 2D–2D*. Similarly, since the output signal of the sense amplifier circuit 100d is proportional to the output of the sense amplifier circuit 100a less the output from the sense amplifier circuit 100b, the output of the sense amplifier stage 144 on output line 152 is proportional to (D*–D)–(D–D*) or 2D*–2D. The differential output between lines 150 and 152 is thus (2D–2D*)–(2D*–2D) or 4D–4D*.

It will be apparent from the above formula and the explanation of the sense amplifier 140 shown in FIG. 3 that it is capable of amplifying only signals that are differential or complementary with respect to each other. However, there are some instances in which it is desirable for an array sense amplifier to be able to receive and amplify data signals that are not complementary with respect to each other. While a separate amplifier for amplifying non-complementary data signals could be provided for this purpose, providing this additional circuitry would increase the cost of memory devices containing both types of amplifiers. Providing separate complementary and non-complementary sense amplifiers may not be cost effective in many situations since the data signals may be non-complementary for very limited operating modes, such as in production test modes. There is therefore a need for a sense amplifier that can amplify complementary data signals in normal operation yet, without adding an extensive amount of circuitry, can also amplify data signals that are not complementary with respect to each other.

SUMMARY OF THE INVENTION

The inventive sense amplifier senses the logic levels of first and second data signals that may but need not be complementary of each other. The sense amplifier includes at least two differential amplifiers each of which has first and second input terminals and at least one output terminal on which an output signal is generated corresponding to the difference in magnitudes between the data signals applied to the first and second input terminals. One of the differential amplifiers receives the first data signal at its first input terminal and a first comparison signal at its second input terminal. The other differential amplifier receives the second data signal at its first input terminal and a second comparison signal at its second input terminal. A mode circuit allows the sense amplifier to function in either a normal, complementary mode or an altered, complementary/non-complementary mode. The mode circuit includes a switch which, in the complementary mode, couples the second data signal to the second input terminal of one differential amplifier, and the first data signal to the second input terminal of the other differential amplifier. In the altered mode, the switch couples a reference voltage to the second input terminals of both differential amplifiers. The reference voltage is less than a first logic level of the first and second data signals and greater than a second logic level of the first and second data signals.

The above-described elements may compose the first stage of a two stage sense amplifier. In such case, the second stage of the sense amplifier may be formed by another pair of differential amplifiers each of which have first and second input terminals and an output terminal. The first input terminal of one differential amplifier is coupled to the output terminal of one of the differential amplifiers in the first stage. Similarly, the first input terminal of the other differential amplifier in the second stage is coupled to the output terminal of the other differential amplifier in the first stage. A second mode circuit includes a second switch which, in the normal mode, couples the second input terminal of one differential amplifier in the second stage to the output of one differential amplifier in the first stage and the second input terminal of the other differential amplifier in the second stage to the output of the other differential amplifier in the first stage. In the altered mode, the second switch couples the second input terminal of one differential amplifier in the second state to the first data signal and the second input terminal of the other differential amplifier in the second stage to the second data signal.

DETAILED DESCRIPTION OF THE INVENTION

Figure 3:
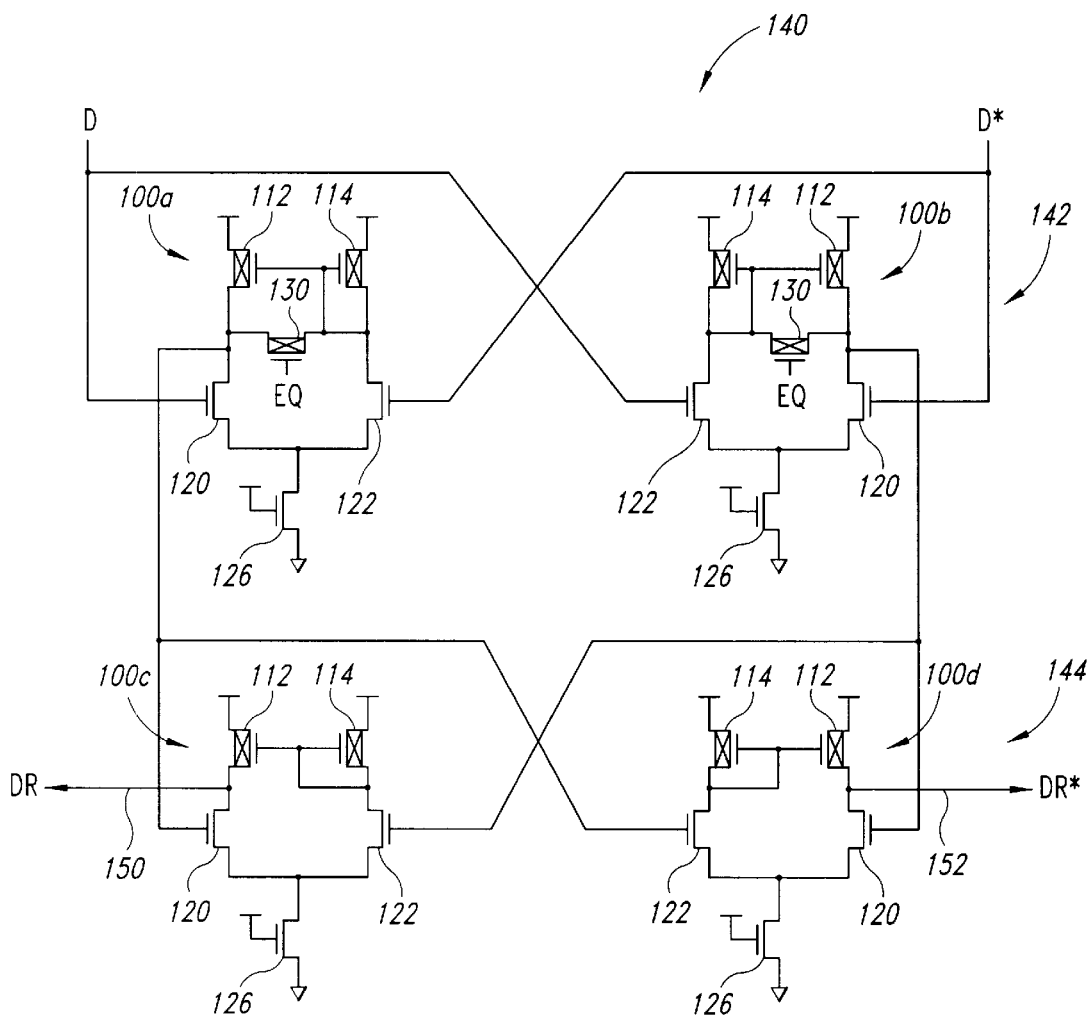
FIG. 3 is a schematic diagram of a conventional sense amplifier using several of the sense amplifier circuits shown in FIG. 2.
Figure 4:
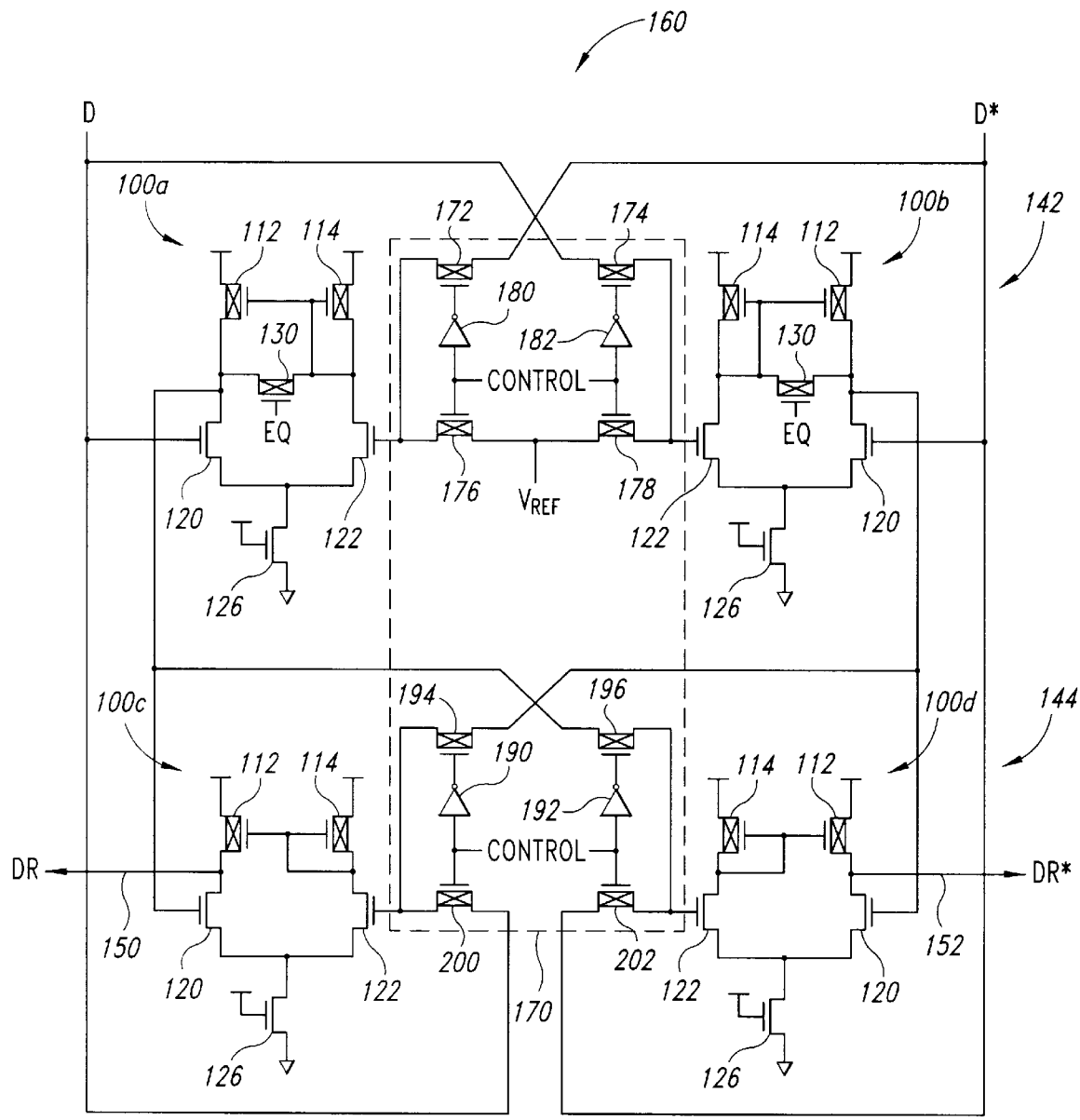
FIG. 4 is a schematic diagram of one embodiment of a sense amplifier according to the present invention.

One embodiment of a sense amplifier 160 that can operate in two modes to amplify complementary or non-complementary signals is illustrated in FIG. 4. Significantly, the sense amplifier 160 is able to perform this dual mode function using substantially the same sense amplifier circuitry shown in FIG. 3 with the addition of only a mode control circuit 170. Thus, in the interest of brevity, the components of the sense amplifier 160 shown in FIG. 4 that are identical to the components in the sense amplifier 140 of FIG. 3 have been provided with the same reference numerals, and an explanation of their operation will not be repeated.

The mode control circuit 170 includes a first pair of PMOS transistors 172, 174 that selectively couple the complementary data signal D* and the data signal D to the inputs of the sense amplifiers 100a, 100b, respectively. The mode control circuit 170 also includes a second pair of PMOS transistors 176, 178 that selectively couple a reference voltage $V_{REF}$ to the inputs of the sense amplifiers 100a, 100b. The PMOS transistors 176, 178 are switched by a signal control CONTROL applied to their gates, while the PMOS transistors 172, 174 are switched by the complement of the control CONTROL signal generated at the outputs of inverters 180, 182.

In operation, when CONTROL is high, the outputs of the inverters 180, 182 are low, thereby turning ON the PMOS transistors 172, 174. In this configuration, the complementary data signal D* is coupled to one input of the sense amplifier circuit 100a while the data signal D is coupled to the other input of the sense amplifier circuit 100a. Similarly, the data signal D is coupled to one input of the sense amplifier circuit 100b while the complementary data signal D* is coupled to the other input of the sense amplifier circuit 100b. Therefore, when the PMOS transistors 172, 174 are ON, the sense amplifiers 100a and 100b compare the data signals D and D* to each other in the same manner as explained above with reference to FIG. 3.

When the CONTROL signal is low, the PMOS transistors 172, 174 are switched OFF by respective high signals at the output of the inverters 180, 182. However, the low CONTROL signal applied to the gates of the PMOS transistors 176, 178 turn ON the transistors 176, 178. The transistors 176, 178 thus couple the reference voltage $V_{REF}$ to the inputs of the sense amplifiers 100a and 100b. In this configuration, the sense amplifier circuit 100a compares the data signal D to the reference voltage $V_{REF}$ while the sense amplifier circuit 100b compares the complementary data signal D* to the reference voltage $V_{REF}$. Since the data signals D and D* are compared to a fixed reference voltage rather than to each other, the sense amplifiers 100a, 100b are capable of amplifying input signals D and D* that are not complementary of each other. However, the voltage for the reference voltage $V_{REF}$ must be selected so that the $V_{REF}$ is between the logic "1" level and the logic "0" level of the data signals D and D*.

Figure 2:
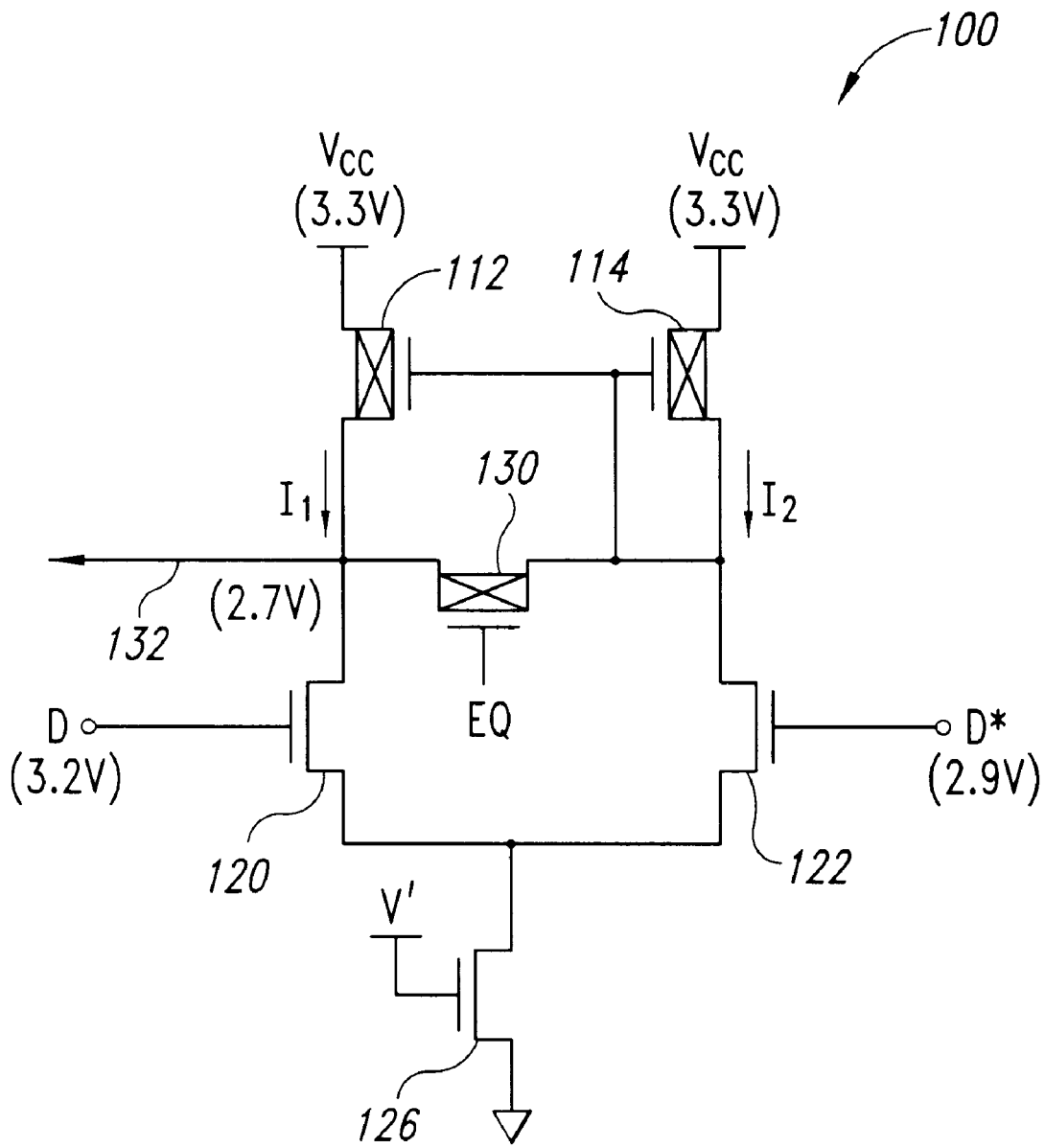
FIG. 2 is a schematic diagram of a conventional sense amplifier circuit.

The mode control circuit 170 also includes similar circuitry for controlling the operation of the second stage of the sense amplifier 160. In normal operation, a high CONTROL signal applied through inverters 190, 192 turns ON PMOS transistors 194, 196 to couple the output of the sense amplifier circuit 100b to the input of the sense amplifier circuit 100c and to couple the output of the sense amplifier circuit 100a to the input of the sense amplifier circuit 100d. In this configuration, the sense amplifier 160 is thus identical to the sense amplifier 140 of FIG. 2 and operates in the same manner as explained above. However, when the CONTROL signal is low, another pair of PMOS transistors 200, 202 is turned on to couple the input of the amplifier 100c to the data signal D rather than to the output of the sense amplifier circuit 100b, and to couple the input of the amplifier 100d to the complementary data signal D* rather than to the output of the sense amplifier circuit 100a.

In operation in the altered non-complementary mode, the output of the sense amplifier circuit 100a will be proportional to $V_{REF}$–D. Similarly, the output of the sense amplifier circuit 100b will be proportional to $V_{REF}$–D*. The output of the sense amplifier circuit 100c is proportional to the data signal D less the output from the amplifier 100a, i.e., $V_{REF}$–D. Thus, the output DR of the amplifier 100c at output line 150 is proportional to 2D–$V_{REF}$. Similarly, since the output DR* of the sense amplifier circuit 100d is proportional to the complementary data signal D* less the output from the sense amplifier circuit 100b, i.e., $V_{REF}$–D*, the output DR* of the sense amplifier circuit 100d on line 152 is thus D–($V_{REF}$–D*) or 2D*–$V_{REF}$. Thus, the sense amplifier 160 shown in FIG. 4 can sense and amplify signals that are non-complementary with respect to each other and it can also sense and amplify signals that are complementary with respect to each other. However, when receiving complementary data signals, the differential voltage between the output lines of the sense amplifiers 100c and 100d will be proportional to (2D–$V_{REF}$)–(2D–$V_{REF}$) or 2D–2D*.

It will be recalled that, in the normal operating mode explained above with reference to FIG. 3, the differential output is 4D–4D*. The reason for the greater differential in the normal mode as compared to the altered mode when CONTROL is low is that comparing the data signals to their complements rather than to a fixed reference voltage results in a greater differential. For this reason, although the sense amplifier 160 could eliminate the mode control circuit 170 and permanently connect the reference voltage $V_{REF}$ to the sense amplifier inputs, it is preferable that the mode control circuit 170 be included to couple the complementary data signals to the sense amplifier inputs in the normal mode.

Figure 5:
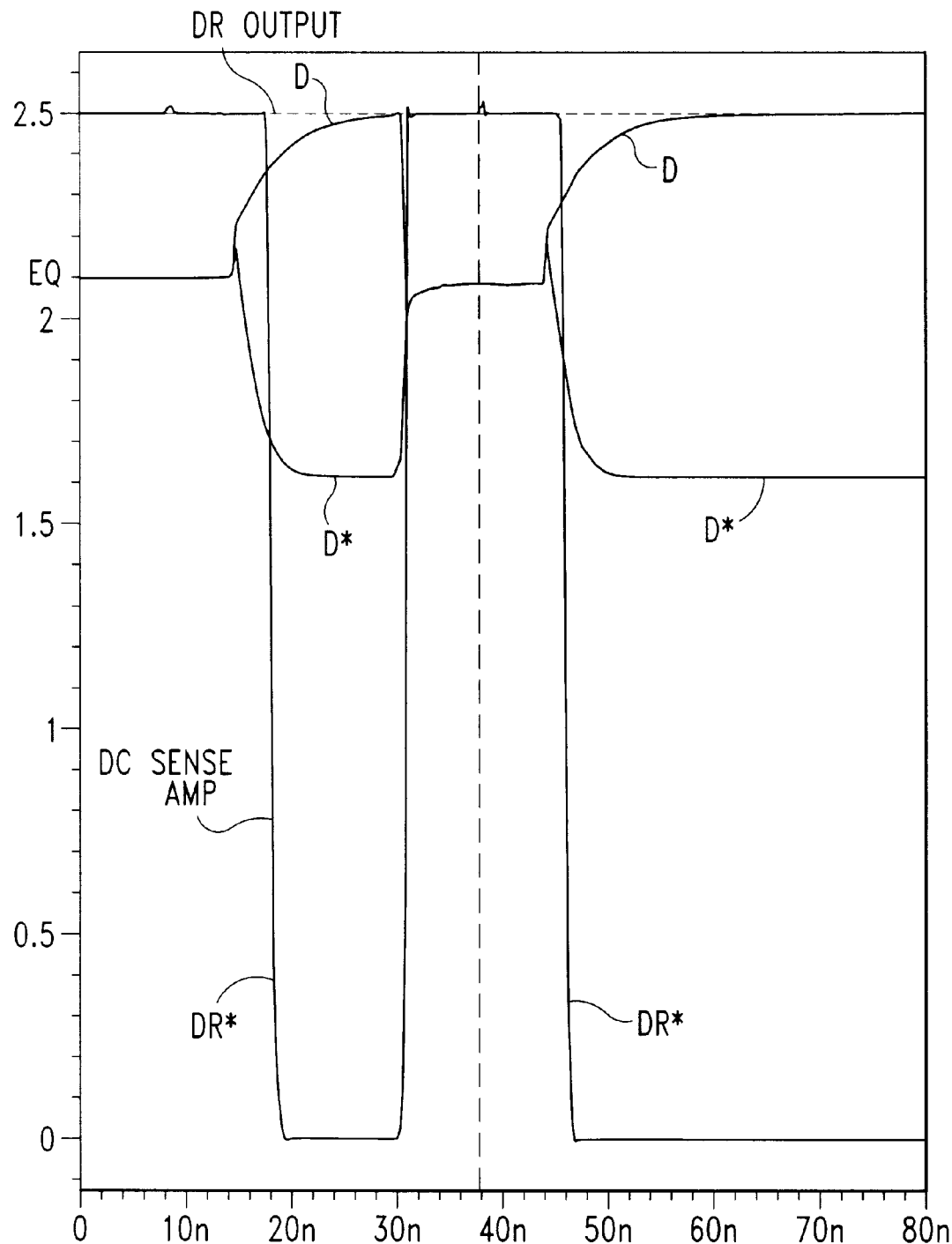
FIGS. 5–7 are waveform diagrams showing the manner in which the sense amplifier of FIG. 4 responds to various input signals.
Figure 6:
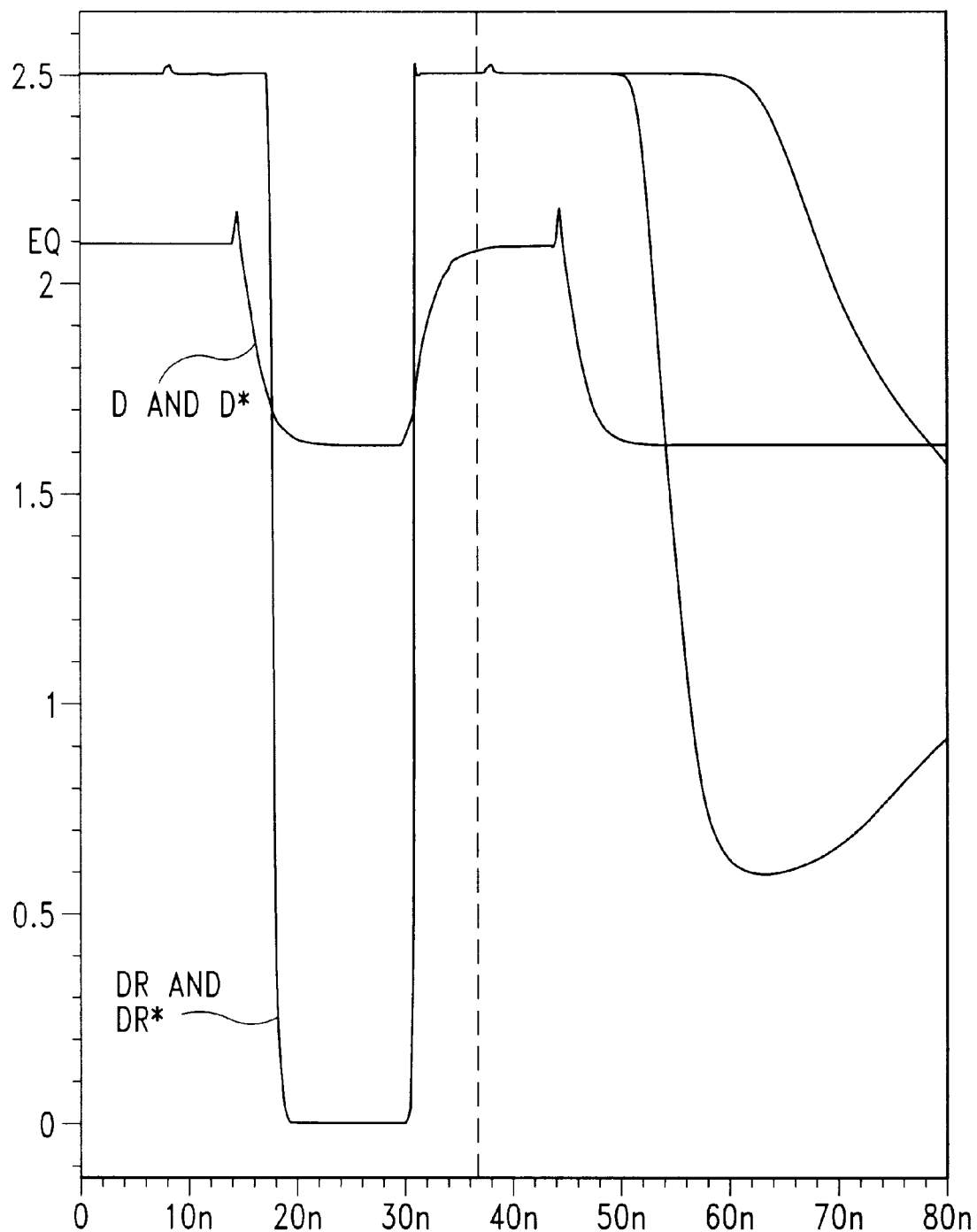
Figure 7:
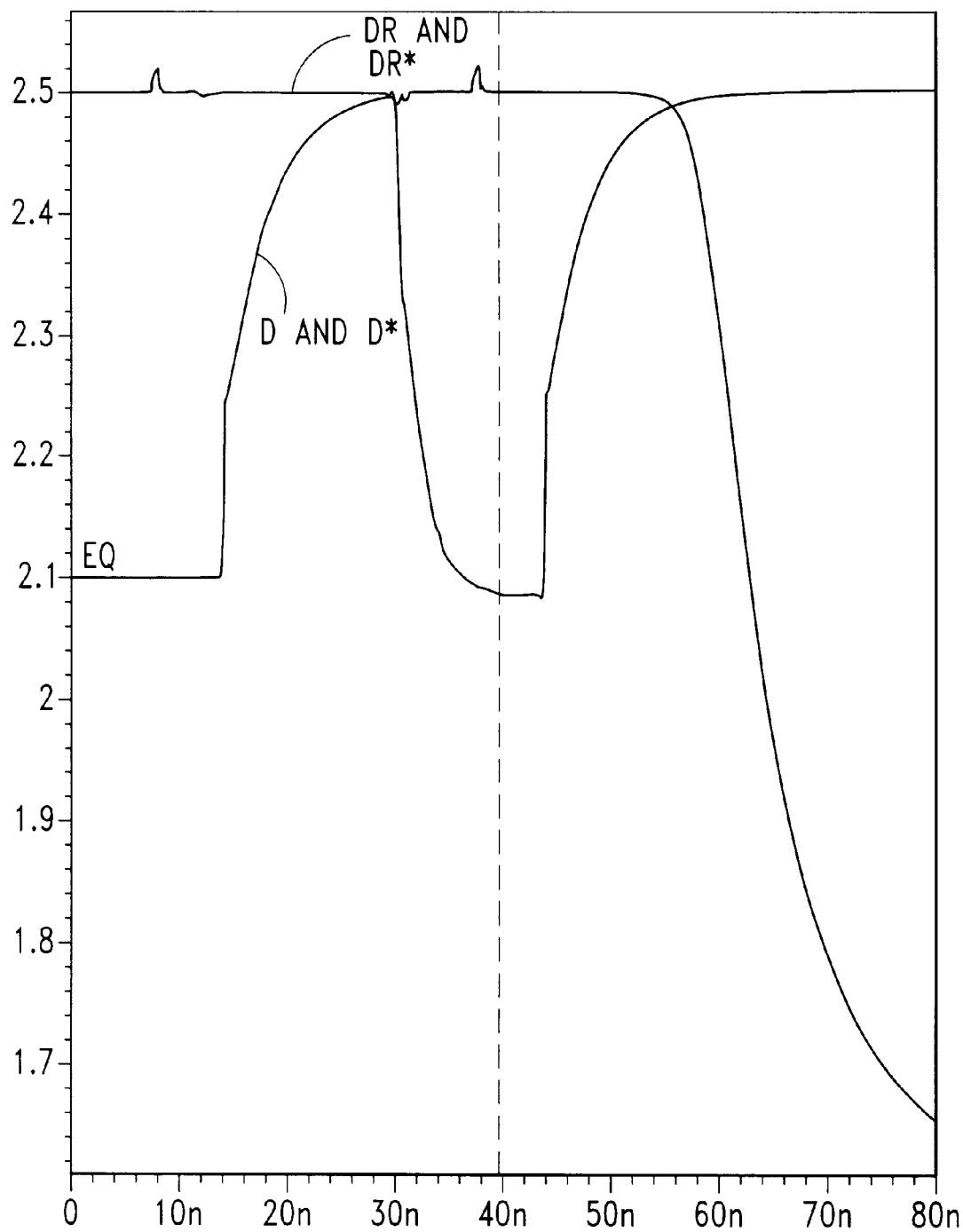

The dynamic operation of the sense amplifier 160 is illustrated in the waveform diagrams of FIGS. 5–7. In each of these FIGS. 5–7, the response of the sense amplifier is shown in the altered mode on the left-hand side and in the normal mode on the right-hand side. Shown on the left-hand side of FIG. 5, the DR and DR* outputs are equilibrated at approximately 2.1 volts followed by a data signal D that is driven high to 2.5 volts and a complementary data signal D* that is driven low to about 1.6 volts. In response thereto, the DR output remains at 2.5 volts while the DR* output is driven low to approximately 0 volts. The left-hand side of FIG. 5, therefore, illustrates how the sense amplifier 160 can operate in the altered mode to generate complementary DR and DR* outputs responsive to complementary data signals D and D*.

With reference to the right-hand side of FIG. 5, the operation of the sense amplifier 160 is shown in the normal mode responsive to the same input signals as the left-hand side of FIG. 5. It will be seen that the output signals DR and DR* are substantially the same as shown on the left-hand side of FIG. 5. However, the output signals DR and DR* are driven to their logic "1" and logic "0" states sooner because of the increased differential signals applied to the input of the sense amplifiers 100a, 100b in the normal mode as explained above.

The response of the sense amplifier 160 to non-complementary logic "0" input signals D and D* is illustrated in FIG. 6. As shown on the left-hand side of FIG. 6, the input signals D and D* are initially equilibrated at about 2.1 volts and are then driven low to about 1.6 volts. In response thereto, the DR and DR* output signals are both driven low from an equilibration level of about 2.5 volts to substantially 0 volts. When the sense amplifier 160 is in the normal mode as illustrated on the right-hand side of FIG. 6, the output signals DR and DR* are unpredictable and undefined.

The left-hand side of FIG. 7 shows the response of the sense amplifier 160 to non-complementary logic "1" input signals D and D*. The input signals D and D* are initially at 2.1 volts and then both driven high to about 2.5 volts. In response, the output signals DR and DR* remain at their 2.5 volt equilibration level corresponding to logic "1." On the other hand, as shown on the right-hand side of FIG. 7, the sense amplifier 160 responds to the same high D and D* signals in the normal mode in an unpredictable manner.

It is therefore seen that the sense amplifier 160 is able to operate in two modes using relatively little additional circuitry as compared to conventional sense amplifiers. In one mode, it operates in essentially the same manner as conventional sense amplifiers without any substantial degradation in performance. In the altered mode, it is able to detect and amplify data signals that may be either complementary or non-complementary.

Figure 1:
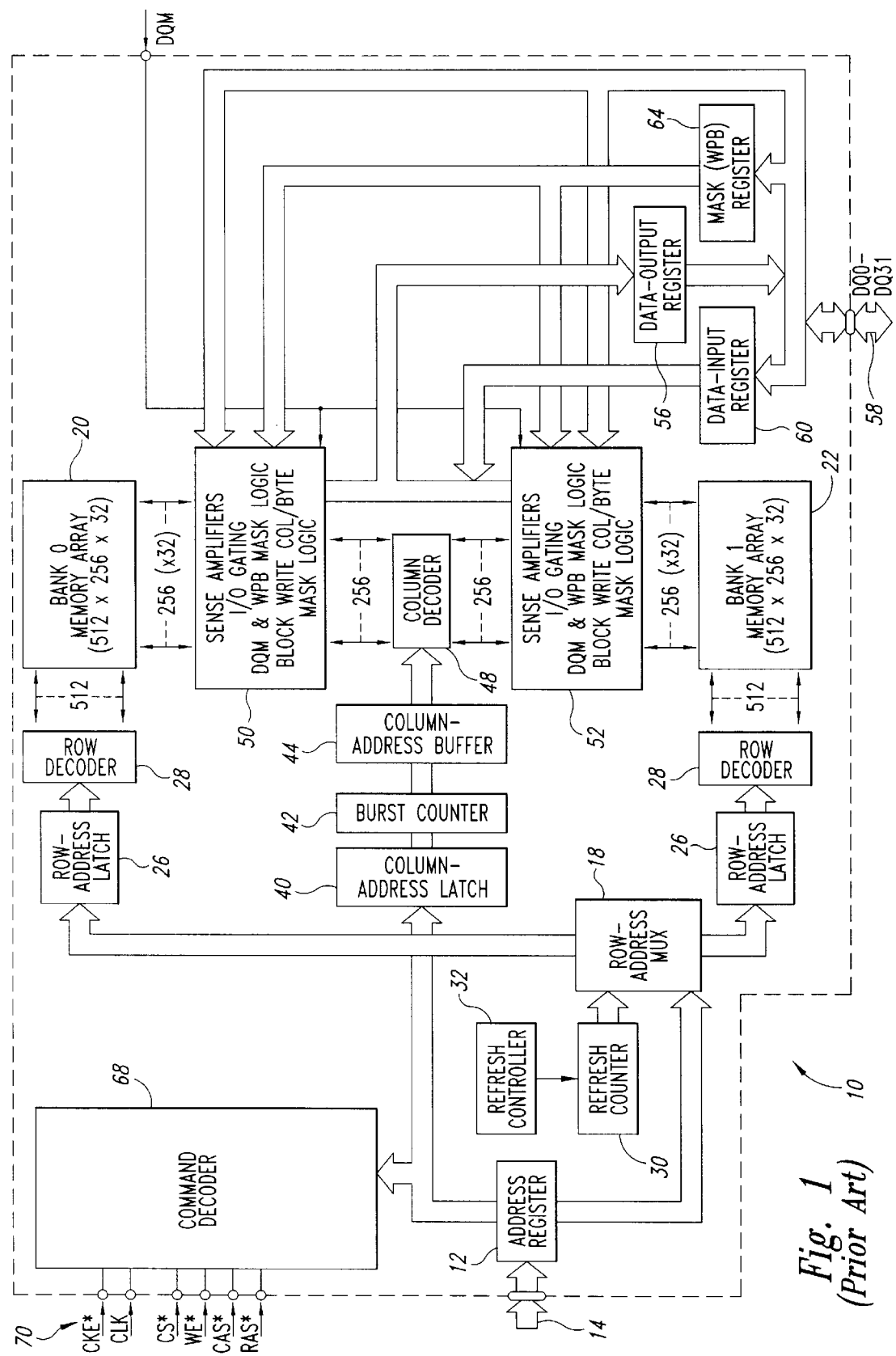
FIG. 1 is a block diagram of a conventional memory device that may use an embodiment of an array sense amplifier in accordance with the present invention.
Figure 8:
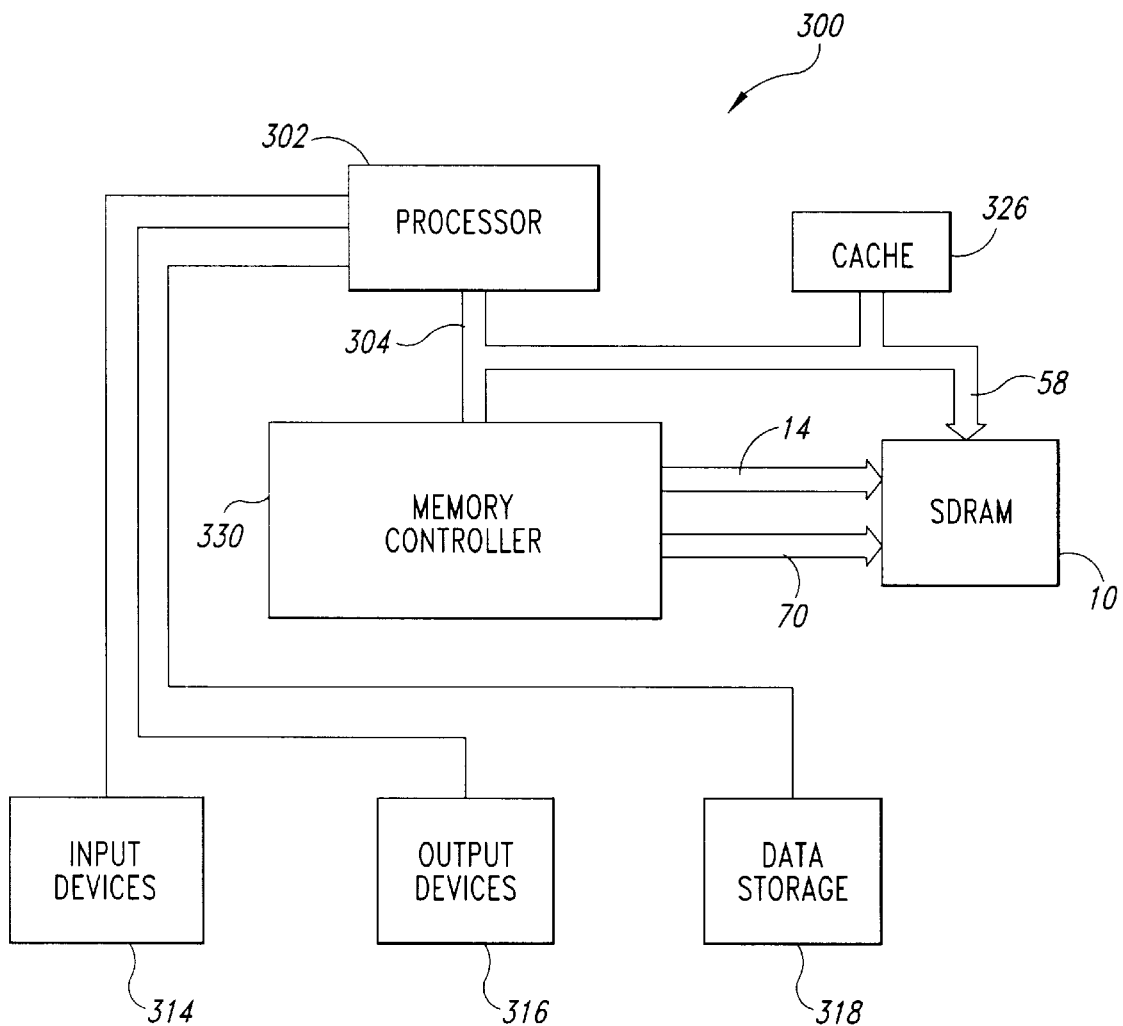
FIG. 8 is a block diagram of a computer system using the memory device of FIG. 1 containing the sense amplifier of FIG. 4.

FIG. 8 is a block diagram of a computer system 300 which includes the SDRAM 10 of FIGS. 1 including the sense amplifier 160 of FIG. 4 in its data output register 56 (FIG. 1). The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor to store data or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM") and to the SDRAM 10 through a memory controller 330. The memory controller 330 normally includes the control bus 70 and the address bus 14 that is coupled to the SDRAM 10. The data bus 58 may be coupled to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. For example, although the sense amplifier is explained as being used in the column circuitry or output data path of an SDRAM, it will be understood that it may be advantageously used in other types of memory devices or even other types of integrated circuits where either complimentary or non-complimentary signals must be amplified. Accordingly, the invention is not limited except as by the appended claims.

We claim:

1. A method of sensing the logic level of first and second data signals, comprising, in a normal mode, comparing the first and second data signals to each other and generating a first output signal indicative of whether the first data signal is greater than the second data signal, and generating a second output signal indicative of whether the second data signal is greater than the first data signal, and, in an altered mode, comparing the first and second data signals to a reference voltage and generating as the first output signal a signal indicative of whether the first data signal is greater than the reference voltage, and generating as the second output signal a signal indicative of whether the second data signal is greater than the reference voltage.

2. The method of claim 1, further comprising:
in the normal mode, comparing the first output signal to the second output signal and providing a third output signal indicative of whether the first output signal is greater than the second output signal;
in the normal mode, comparing the second output signal to the first output signal and providing a fourth output signal indicative of whether the second output signal is greater than the first output signal;
in the altered mode, comparing the first output signal to the first data signal and providing a signal as the third output signal indicative of whether the first output signal is greater than the first data signal; and
in the altered mode, comparing the second output signal to the second data signal and providing a signal as the fourth output signal indicative of whether the second output signal is greater than the second data signal.

3. The method of claim 1 wherein the first and second data signals are at either of substantially first and second voltage levels, and wherein the reference voltage is substantially midway between the first and second voltage levels.

4. A method of sensing the logic level of first and second data signals, comprising, in a normal mode, comparing the first and second data signals to each other and generating a first output signal indicative of whether the first data signal is greater than the second data signal, and, in an altered mode, comparing at least one of the first and second data signals to a first reference voltage and generating a second output signal indicative of whether the compared data signal is greater than the first reference voltage.

5. The method of claim 4 wherein the first and second output signals are generated at a common output terminal.

6. The method of claim 4 wherein the first data signal is compared to the first reference voltage, and wherein the method further comprises comparing the second data signal to a second reference voltage and generating a third output signal indicative of whether the second data signal is greater than the second reference voltage.

7. The method of claim 6 wherein the first and second reference voltages have the same magnitude.

8. The method of claim 4 wherein the first and second data signals are at either of substantially first and second voltage levels, and wherein the first reference voltage is substantially midway between the first and second voltage levels.

9. A method of sensing the logic level of first and second data signals, comprising, in a normal mode, comparing the first and second data signals to each other and generating a first output signal indicative of whether the first data signal is greater than the second data signal, and generating a second output signal indicative of whether the second data signal is greater than the first data signal, and, in an altered mode, comparing the first data signal to a first reference voltage and generating as the first output signal a signal indicative of whether the first data signal is greater than a first reference voltage, and comparing the second data signal to a second reference voltage and generating as the second output signal a signal indicative of whether the second data signal is greater than the reference voltage.

10. The method of claim 9 wherein the first and second reference voltages have the same magnitude.

11. The method of claim 9, further comprising:
in the normal mode, comparing the first output signal to the second output signal and providing a third output signal indicative of whether the first output signal is greater than the second output signal;
in the normal mode, comparing the second output signal to the first output signal and providing a fourth output signal indicative of whether the second output signal is greater than the first output signal;
in the altered mode, comparing the first output signal to the first data signal and providing a signal as the third output signal indicative of whether the first output signal is greater than the first data signal; and
in the altered mode, comparing the second output signal to the second data signal and providing a signal as the fourth output signal indicative of whether the second output signal is greater than the second data signal.

12. The method of claim 9 wherein the first and second data signals are at either of substantially first and second voltage levels, and wherein the reference voltage is substantially midway between the first and second voltage levels.

* * * * *